(12) United States Patent  
Matsuzaki et al.

(10) Patent No.: US 7,817,222 B2
(45) Date of Patent: *Oct. 19, 2010

(54) DISPLAY DEVICE (75) Inventors: Yukio Matsuzaki, Mobara (JP); Masaki Tsubokura, Mobara (JP)

(73) Assignee: Hitachi Displays, Ltd., Chiba (JP)

(*) Notice: Subject to any disclaimer, the term of this patent is extended or adjusted under 35 U.S.C. 154(b) by 0 days.

This patent is subject to a terminal disclaimer.

(21) Appl. No.: 12/423,244

(22) Filed: Apr. 14, 2009

(65) Prior Publication Data

US 2009/0195727 A1 Aug. 6, 2009

Related U.S. Application Data (63) Continuation of application No. 11/847,382, filed on Aug. 30, 2007, now Pat. No. 7,522,249.

(30) Foreign Application Priority Data

Sep. 1, 2006 (JP) ............................. 2006-237585

(51) Int. Cl.
*G02F 1/1333* (2006.01)
(52) U.S. Cl. .......................................... 349/58; 349/60
(58) Field of Classification Search .............. 349/58, 349/60, 149, 151–152, 161
See application file for complete search history.

(56) References Cited

U.S. PATENT DOCUMENTS 7,453,532 B2 * 11/2008 Kondo et al. ................. 349/58
7,522,249 B2 * 4/2009 Matsuzaki et al. .......... 349/149

FOREIGN PATENT DOCUMENTS

JP 2003-195340 7/2003

* cited by examiner

*Primary Examiner*—Mark A Robinson
*Assistant Examiner*—Michael P Mooney
(74) *Attorney, Agent, or Firm*—Antonelli, Terry, Stout & Kraus, LLP.

(57) ABSTRACT

A display device includes a display panel, a first printed circuit board, a first flexible printed wiring board connected to the display panel and the first printed circuit board, a second printed circuit board, a second flexible printed wiring board connected to the first printed circuit board and the second printed circuit board, and a frame member on which the first printed circuit board and the second printed circuit board are mounted. The display device also includes a film shaped member which overlaps a surface of the first printed circuit board which faces the frame member and projects from an end portion of the first printed circuit board toward the second printed circuit board along the second flexible printed wiring board.

7 Claims, 7 Drawing Sheets

DISPLAY DEVICE

CROSS REFERENCE TO RELATED APPLICATION

This application is a continuation application of U.S. application Ser. No. 11/847,382, filed Aug. 30, 2007, now U.S. Pat. 7,522,249, the contents of which are incorporated herein by reference.

CLAIM OF PRIORITY

The present application claims priority from Japanese application serial No. 2006-237585, filed on Sep. 1, 2006, the content of which is hereby incorporated by reference into this application.

BACKGROUND OF THE INVENTION

1. Field of the Invention

The present invention relates to a display device, and more particularly to a technique which is effectively applicable to a display device which arranges a printed circuit board connected to the display device by a flexible printed wiring board on a lower side of a display region.

2. Description of the Related Art

Recently, as a display device such as a display for a television receiver set or the personal computer (PC), a display device which is referred to as a "flat panel display" has been increased in number. As one example of the flat panel display, a liquid crystal display device which includes a liquid crystal display panel is named.

The liquid crystal display panel is a display panel which seals a liquid crystal material between a pair of substrates, wherein one substrate out of the pair of substrates includes a plurality of scanning signal lines, a plurality of video signal lines and a plurality of TFT elements which is arranged in a matrix array, for example.

The liquid crystal display device includes, besides the liquid crystal display panel, for example, a plurality of printed circuit boards which controls the generation of data signals of videos or images which are displayed on the display panel and controls timings of inputting the generated data signals to scanning signal lines and video signal lines. Further, when the liquid crystal display device is a transmissive or transflective liquid crystal display device, on a back side (back surface) of a display screen of the liquid crystal display panel, a light source referred to as a backlight unit is arranged. Further, the liquid crystal display panel, the printed circuit board, the backlight unit and the like are integrally assembled to each other using a frame member.

In the liquid crystal display device, the plurality of printed circuit boards is, for example, constituted of a printed circuit board (hereinafter, referred to as a Tcon substrate) which includes a timing controller, a printed circuit board (hereinafter, referred to as a drain PCB) which relays signals inputted into the video signal lines formed on the liquid crystal display panel from the Tcon substrate and the like. The Tcon substrate is generally mounted on the back surface of the frame member. Further, the drain PCB and the like other than the Tcon substrate are generally mounted on an outer peripheral surface side of the frame member, that is, on a surface of the frame member arranged substantially orthogonal to the display screen of the display panel in many cases. Here, for example, lines formed on the Tcon substrate and lines formed on the drain PCB are connected with each other by a flexible printed wiring board. Further, the lines formed on the drain PCB and the video signal lines formed on the liquid crystal display panel are connected with each other by way of a TCP or a COF which mounts a driver IC thereon, for example.

Further, with respect to the liquid crystal display device, for example, there also has been known a liquid crystal display device in which the drain PCB and the like other than the Tcon substrate are also mounted on the back surface of the frame member, the flexible printed wiring board is folded by substantially 180 degrees, for example, and lines formed on the drain PCB and the video signal lines formed on the liquid crystal display panel are connected with each other (for example, see the following patent document 1).

[Patent Document 1] JP-A-2003-195340

Here, conventionally, a liquid crystal display device which is used as a display for the television receiver set or the PC arranges the drain PCB on an upper-side side of the display region in many cases. However, along with the increase of a heat value of a driver IC and the increase of a heat value of a backlight attributed to a demand for high definition and a high speed operation (high response) of recent years, heat is accumulated in an upper side of a display region, that is, in an upper side of a housing and hence, the temperature of the liquid crystal display device is liable to be elevated. Accordingly, due to the influence of the heat accumulated in the upper side of the housing, operations of circuits formed on the Tcon substrates and the drain PCB leading to the deterioration of display quality.

Accordingly, in a recent liquid crystal display device, there exists a case that the drain PCB is arranged on a lower side of the display region.

Figure 5:
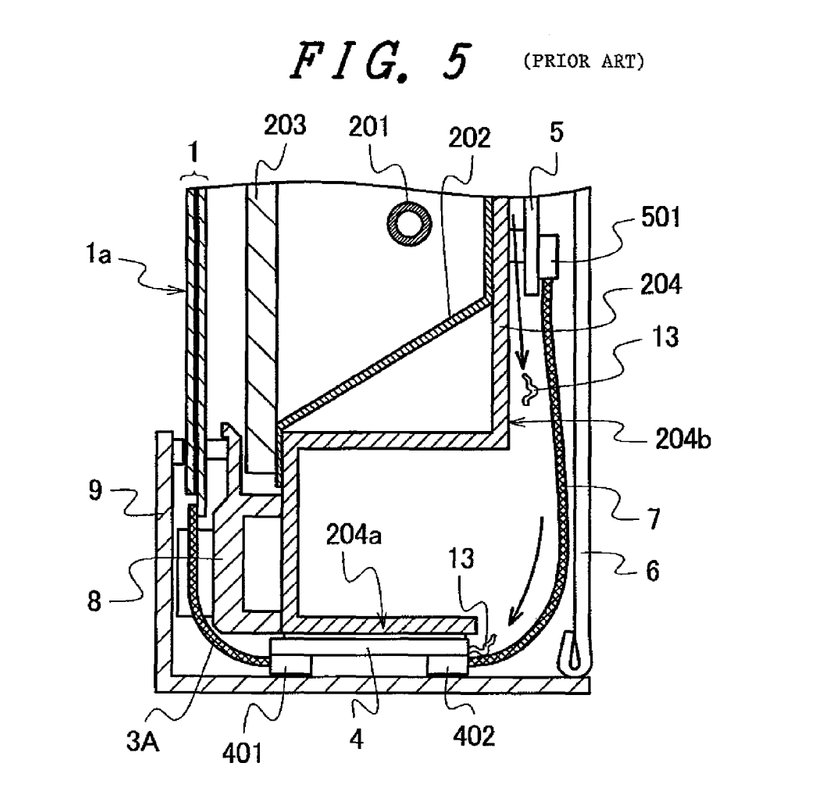
FIG. 5 is a schematic cross-sectional view for explaining one of drawbacks of a conventional liquid crystal display device.

However, when the drain PCB is arranged on the lower side of the display region, for example, there exists a drawback that short-circuiting is liable to easily occur in a connection portion between the drain PCB and the flexible wiring board. One of the reasons which give rise to such drawbacks is briefly explained in conjunction with FIG. 5. FIG. 5 is a schematic cross-sectional view for explaining one of the drawbacks of the conventional liquid crystal display device.

In the conventional liquid crystal display device which arranges the drain PCB on the lower side of the display region. FIG. 5 shows the cross-sectional constitution of a lower side portion of the display region in a state that the liquid crystal display device is arranged on a base, for example. In the example shown in FIG. 5, a backlight unit 2 which is constituted of a tubular light source 201 (fluorescent lamp), a reflector 202, a light diffusion plate 203, a lower frame 204 and the like is arranged on a back surface of a liquid crystal display panel 1. Further, the liquid crystal display panel 1 and the backlight 2 are integrally assembled with a lower frame 204, a picture-frame-like mold frame 8 which is arranged between the liquid crystal display panel 1 and the backlight unit 2, and an upper frame 9 which is arranged on a display screen 1a side of the liquid crystal display panel 1.

Further, a Tcon substrate 5 is mounted on a bottom surface 204b of the lower frame 204, and a drain PCB 4 is mounted on an outer peripheral surface 204a of the lower frame 204, that is, on a surface of the lower frame 204 which is arranged substantially orthogonal to the display screen 1a of the liquid crystal display panel 1.

Here, lines formed on the liquid crystal display panel 1 and the lines formed on the drain PCB4 are connected with each other by way of a semiconductor package 3A such as a TCP or a COF on which a driver IC is mounted, for example. The lines formed on the liquid crystal display panel 1 and lines formed on the semiconductor package 3A are connected with each other using an adhesive material such as a solder or an anisotropic conductive resin, for example. Further, the lines formed on the drain PCB4 and the lines formed on the semiconductor package 3A are mechanically connected with each other using a connector 401 mounted on the drain PCB4, for example. Here, the connection between the lines formed on the drain PCB4 and the lines formed on the semiconductor package 3A is not limited to the above-mentioned connection performed using the connector 401, and there may be a case that the lines formed on the drain PCB4 and the lines formed on the semiconductor package 3A are connected with each other using an adhesive material such as a solder or an anisotropic conductive resin.

Here, the lines formed on the drain PCB4 and lines formed on the Tcon substrate 5 are connected with each other by way of a flexible printed wiring board 7. The lines formed on the drain PCB4 and lines formed on the flexible printed wiring board 7 are mechanically connected with each other using a connector 402 mounted on the drain PCB4. In the same manner as the above-mentioned connection, the lines formed on the Tcon substrate 5 and the lines formed on the flexible printed wiring board 7 are mechanically connected with each other using a connector 501 mounted on the Tcon substrate 5, for example.

To briefly explain assembling steps of such a liquid crystal display device, first of all, an assembling operation of the backlight unit is performed such that the reflector 202, the tubular light source 201 and the like are housed in the lower frame 204, and the lower fame 204 is covered with the light diffusion plate 203. Next, the mold frame 8 and the liquid crystal display panel 1 are mounted on the light diffusion plate 203 of the backlight unit. Here, for example, on the liquid crystal display panel 1, the semiconductor package 3A, the drain PCB4 and the flexible printed wiring board 7 are already mounted, the liquid crystal display panel 1 is mounted on the mold frame 8 and, thereafter, the drain PCB4 is mounted on an outer peripheral surface 204a of the lower frame 204 by bending the semiconductor package 3A. Next, the upper frame 9 is arranged to cover the liquid crystal display panel 1, and the upper frame 9 and the mold frame 8, the upper frame 9 and the lower frame 204 are fixed to each other using bolts or the like.

Then, for example, the Tcon substrate 5 is mounted on a bottom surface 204b of the lower frame 204 using bolts, and the flexible printed wiring board 7 which is connected to the drain PCB4 is connected to the Tcon substrate 5.

In assembling such a liquid crystal display device in accordance with such steps, for example, in mounting the Tcon substrate 5 on the lower frame 204 using bolts, there exists a possibility that a metal foreign material 13 is generated between the Tcon substrate 5 and the bottom surface 204b of the lower frame 204. This operation is performed in a state that the liquid crystal display device 1 is rotated in the counterclockwise direction by 90° from a state shown in FIG. 5, that is, in a state that the bottom surface 204b of the lower frame 204 is directed in the upward direction and hence, the generated metal foreign material 13 stays between the Tcon substrate 5 and the lower frame 204. Accordingly, when the Tcon substrate 5 and the flexible printed wiring board 7 are connected with each other, for example, when the Tcon substrate 5 and the flexible printed wiring board 7 are brought into a state shown in FIG. 5, for example, without being aware of the presence of the generated metal foreign material 13, the metal foreign material 13 which stays between the Tcon substrate 5 and the lower frame 204 falls. Here, when the metal foreign material 13 falls along the flexible printed wiring board 7, the fallen metal foreign material 13 arrives at a connection portion between the connector 402 of the drain PCB4 and the flexible printed wiring board 7. Further, when the metal foreign material 13 intrudes into the inside of the connector 402, short-circuiting is liable to easily occur in the inside of the connector 402.

When the short circuiting is generated attributed to such a metal foreign material 13, for example, a circuit of the drain PCB4 performs an abnormal operation and hence, an abnormal lighting defect occurs in a lighting inspection of the liquid crystal display device which is conducted after assembling the liquid crystal display device. When the abnormal lighting defect occurs, the liquid crystal display device is disassembled once to find out causes of the abnormal lighting defect. After repairing the causes or exchanging the printed circuit board, the flexible printed wiring board or the like, the liquid crystal display device is assembled again, and the lighting inspection is performed. Accordingly, when the abnormal lighting defect fluently occurs in the inside of the connector attributed to the short-circuiting, there also arises a drawback that the efficiency of the assembling operation of the liquid crystal display device is lowered.

Here, the above-mentioned drawbacks are not limited to the liquid crystal display device having the constitution shown in FIG. 5, and also occur on a liquid crystal display device which mounts a printed circuit board on a lower side of a display region and, further, to a display device which includes a display panel other than the liquid crystal display panel and mounts a printed circuit board on a lower side of a display region.

SUMMARY OF THE INVENTION

Accordingly, it is an object of the present invention to provide, in a display device which mounts a printed circuit board on a lower side of a display region, a technique which can prevent the intrusion of a foreign material into a connector of the printed circuit board.

The above-mentioned and other objects and novel features of the present invention will become apparent due to the description of this specification and attached drawings.

To briefly explain typical inventions among inventions disclosed in this application, they are as follows.

(1) The present invention is directed to a display device including a first printed circuit board, a second printed circuit board, a flexible printed wiring board which connects the first printed circuit board and the second printed circuit board, and a frame member on which the first printed circuit board and the second printed circuit board are mounted, the first printed circuit board including a connector which mechanically connects a line formed on the first printed circuit board and a line formed on the flexible printed wiring board, wherein the display device includes a foreign material intrusion preventing member which has a region overlapping the connector of the first printed circuit board as viewed in a plan view on a surface side of the first printed circuit board which faces the frame member in an opposed manner and projects from an end portion of the first printed circuit board toward a second printed circuit board side along the flexible printed wiring board.

(2) In the display device having the constitution (1), a surface of the first printed circuit board which faces the frame member in an opposed manner and a surface of the second printed circuit board which faces the frame member in an opposed manner are arranged substantially orthogonal to each other.

(3) In the display device having the constitution (1) or (2), the region of the foreign material intrusion preventing member which overlaps the connector of the first printed circuit board as viewed in a plan view is sandwiched between the first printed circuit board and the frame member.

(4) In the display device having any one of the constitutions (1) to (3), the portion of the foreign material intrusion preventing member which projects from the end portion of the first printed circuit board toward the second printed circuit board side has an end portion thereof arranged closer to the second printed circuit board brought into contact with the flexible printed wiring board.

(5) In the display device having any one of the constitutions (1) to (4), the region of the foreign material intrusion preventing member which overlaps the connector of the first printed circuit board as viewed in a plan view is adhered to the frame member by a tacky adhesive material or an adhesive material.

(6) In the display device having any one of the constitutions (1) to (4), the region of the foreign material intrusion preventing member which overlaps the connector of the first printed circuit board as viewed in a plan view is adhered to the first printed circuit board by a tacky adhesive material or an adhesive material.

(7) In the display device having any one of the constitutions (1) to (3), the portion of the foreign material intrusion preventing member which projects from the end portion of the first printed circuit board toward the second printed circuit board side has an end portion thereof arranged closer to the second printed circuit board adhered to the flexible printed wiring board.

(8) In the display device having any one of the constitutions (1) to (7), the foreign material intrusion preventing member is a film-like member which is made of an insulation material.

There may be a case that a metal foreign material is generated between the second printed circuit board and the frame member and, for example, the first printed circuit board and the second printed circuit board are arranged on a lower side of the display region, and a surface of the second printed circuit board which faces the frame member in an opposed manner is erected to direct in the approximately vertical direction, and the metal foreign material falls toward the first printed circuit board side. According to the present invention, even such a case may arise, it is possible to prevent the intrusion of the metal foreign material into the connector of the first printed circuit board due to the provision of the foreign material intrusion preventing member. Accordingly, short-circuiting of the connector attributed to the metal foreign material can be prevented.

DESCRIPTION OF THE PREFERRED EMBODIMENT

Hereinafter the present invention is explained in detail in conjunction with modes for carrying out the invention (embodiments) by reference to drawings.

Here, in all drawings for explaining the embodiments, parts having identical functions are given same numerals and their repeated explanation is omitted.

FIG. 1A to FIG. 1D are schematic views respectively showing one example of the schematic constitution of a liquid crystal display device of one embodiment according to the present invention.

Figure 1A:
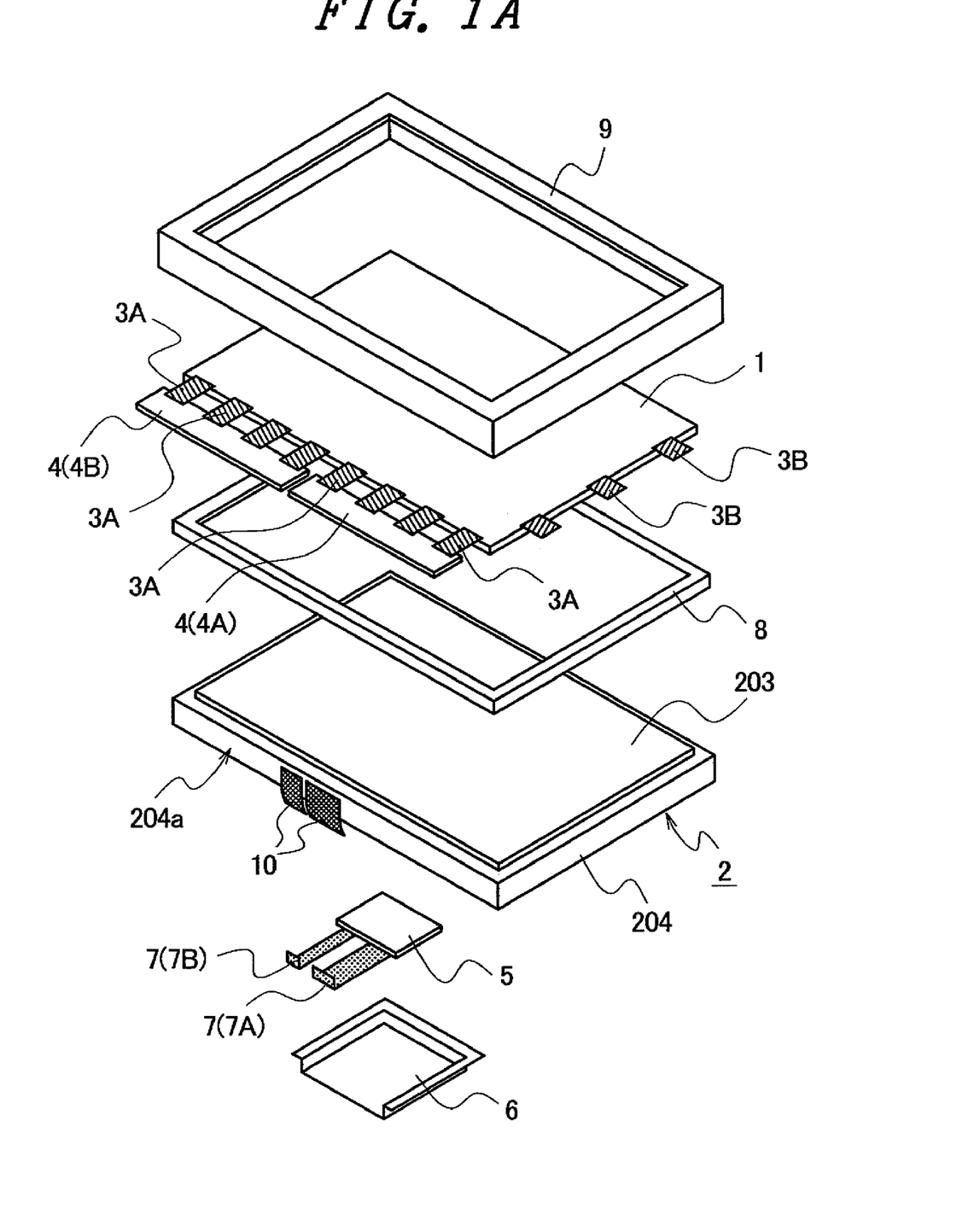
FIG. 1A is a schematic exploded perspective view showing one example of the schematic constitution of a liquid crystal display device of one embodiment according to the present invention.
Figure 1B:
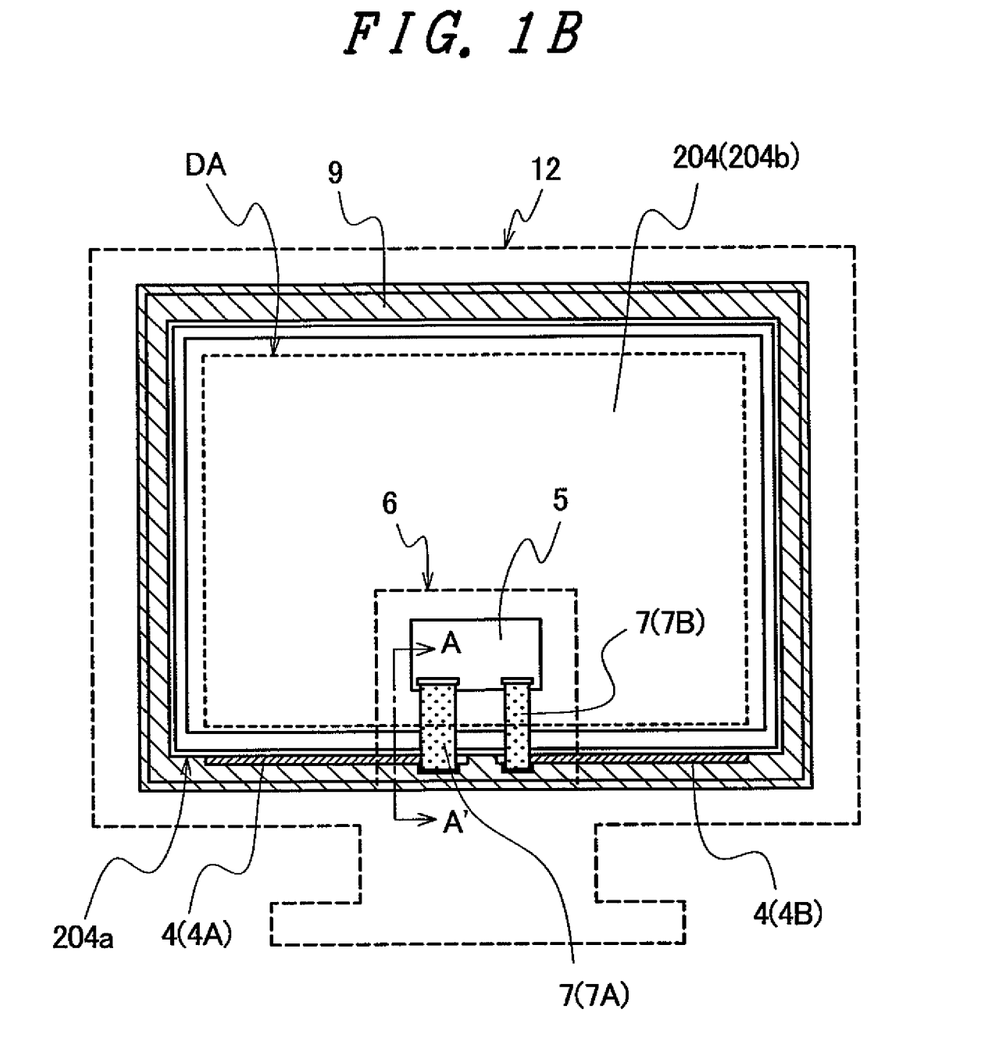
FIG. 1B is a schematic plan view showing one example of a state that the liquid crystal display device of this embodiment is housed in a casing.
Figure 1C:
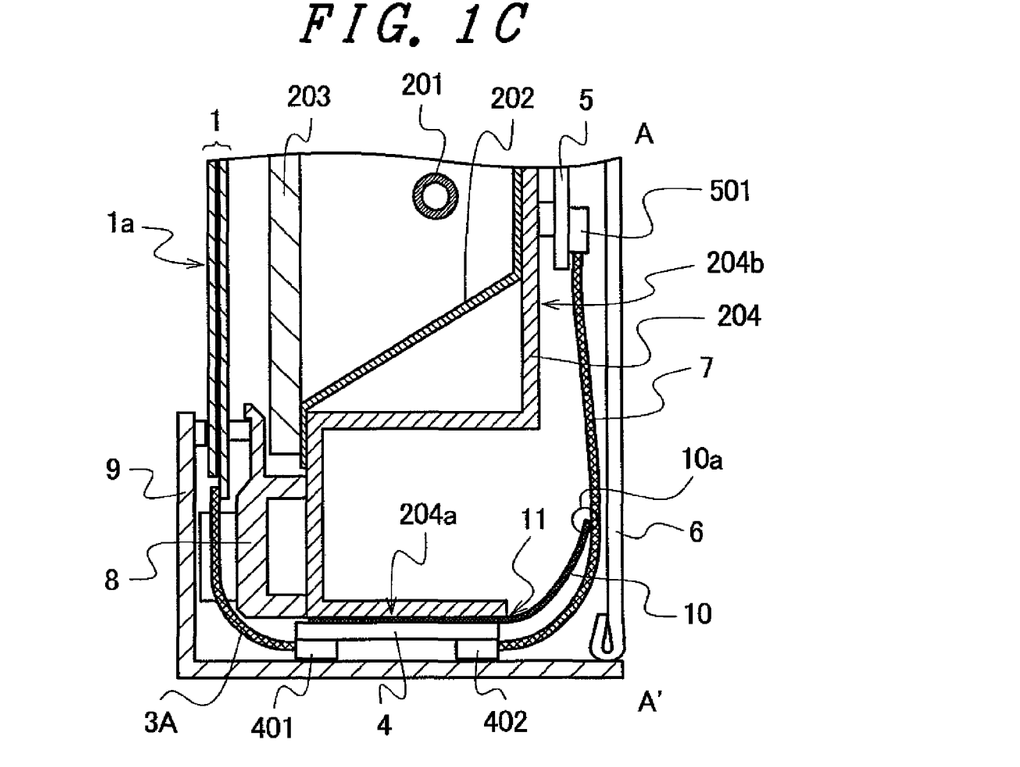
FIG. 1C is a schematic cross-sectional view showing one example of the cross-sectional constitution of the liquid crystal display device taken along a line A-A' in FIG. 1B.
Figure 1D:
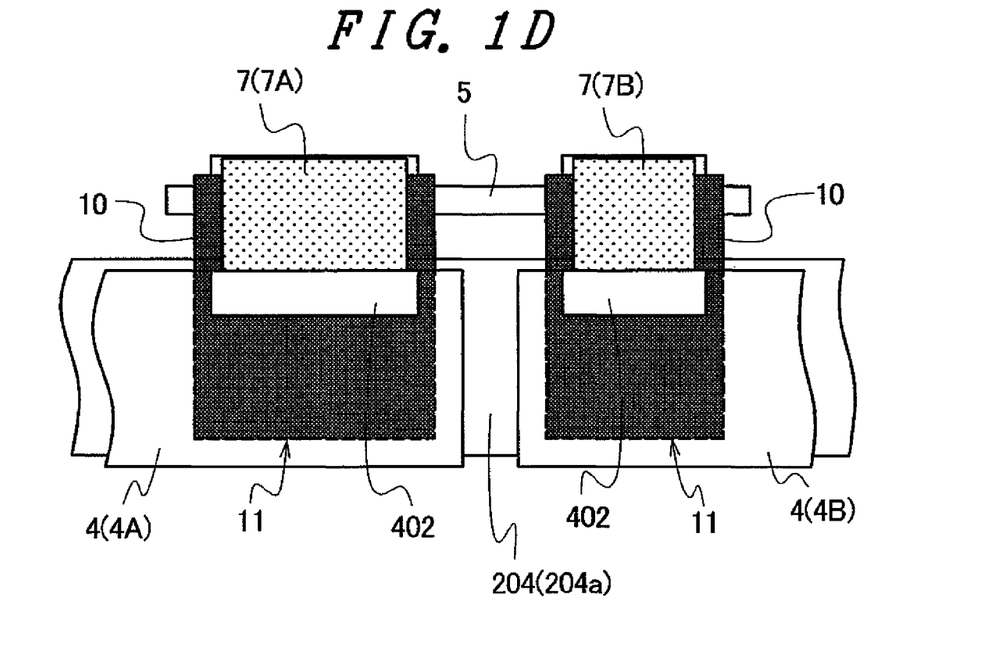
FIG. 1D is a schematic lower surface view showing a connection portion between a first printed circuit board and a second printed circuit board in FIG. 1B in an enlarged manner.

FIG. 1A is a schematic exploded perspective view showing one example of the schematic constitution of the liquid crystal display device of one embodiment according to the present invention. FIG. 1B is a schematic plan view showing one example of a state that the liquid crystal display device of this embodiment is housed in a casing. FIG. 1C is a schematic cross-sectional view showing one example of the cross-sectional constitution of the liquid crystal display device taken along a line A-A' in FIG. 1B. FIG. 1D is a schematic lower surface view showing a connection portion between a first printed circuit board and a second printed circuit board in FIG. 1B in an enlarged manner.

In this embodiment, one example of the constitution of a liquid crystal display device to which the present invention is applied and the advantageous effects of the liquid crystal display device are explained by taking a transmissive liquid crystal display device which is used in a display for a television or a personal computer as an example.

As shown in FIG. 1A, FIG. 1B and FIG. 1C, the transmissive liquid crystal display device includes a liquid crystal display panel 1, and a backlight unit 2 arranged on a rear side (back surface side) of the liquid crystal display panel 1, for example.

The liquid crystal display panel 1 is a liquid crystal display panel which seals a liquid crystal material between a pair of substrates. The constitution of the pair of substrates, a kind of the liquid crystal material and the like may be equal to corresponding parts of the conventional transmissive liquid crystal display panel. Accordingly, an explanation of the specific constitution of the liquid crystal display panel 1 is omitted.

Further, in the liquid crystal display panel 1 which is used in the liquid crystal display device of this embodiment, on one substrate out of the pair of substrates, TFT elements which are used as active elements (also referred to as switching elements) are arranged within a display region DA in a matrix array. The substrate is referred to as a TFT substrate in general. The TFT substrate forms a plurality of video signal lines and a plurality of scanning signal lines thereon besides the TFT elements.

The backlight unit 2 is, for example, formed of a tubular light source 201 such as a cold cathode fluorescent tuber a reflector 202, a light diffusion plate 203, an inverter printed circuit board (not shown in the drawing) which controls turning on-and-off of the tubular light source, a substantially box-shaped frame member 204 (hereinafter, referred to as a lower frame) which houses the tubular light source 201, the reflector 202 and the like therein.

Further, in the liquid crystal display device of this embodiment, a plurality of semiconductor packages 3A such as TCPs or COFs which is connected to the video signal lines is mounted on one side of the liquid crystal display panel 1, for example. Further, on another side of the liquid crystal display panel 1, a plurality of other semiconductor packages 3B which is connected to the scanning signal lines is mounted, for example.

The semiconductor packages 3A, 3B are, for example, respectively formed by mounting an IC chip referred to as a driver IC on a flexible printed wiring board which is obtained by forming a conductive pattern (wiring) on a surface of an insulation film such as a polyimide film. Here, lines formed on the semiconductor packages 3A and the video signal lines formed on the TFT substrate are connected with each other using adhesive material such as a solder or an anisotropic conductive resin, for example, while lines formed on the semiconductor packages 3B and the scanning signal lines formed on the TFT substrate are connected with each other using adhesive material such as a solder or an anisotropic conductive resin, for example.

Further, the plurality of semiconductor packages 3A has end portions thereof on a side opposite to end portions thereof mounted on the liquid crystal display panel 1 mounted on the first printed circuit board 4 (4A, 4B). The first printed circuit board 4 is, for example, divided into two printed circuit boards 4A, 4B, and the plurality of semiconductor packages 3A is mounted on either one of two printed circuit boards 4A, 4B. Further, the first printed circuit board 4 (4A, 4B) is, for example, mounted on an outer peripheral-side surface 204a of the lower frame 204. Hereinafter, when it is necessary to distinguish two first printed circuit boards from each other, the respective printed circuit board are described as "first printed circuit board 4A" and "first printed circuit board 4B" and when it is unnecessary to distinguish two first printed circuit boards from each other, the printed circuit boards are described as "first printed circuit boards 4".

Further, the lines formed on the first printed circuit board 4 and the lines formed on the semiconductor packages 3A are mechanically connected with each other using a connector 401 mounted on the first printed circuit board 4, for example. Here, the mechanical connection using the connector 401 implies that, for example, the respective lines are electrically connected with each other by fixing them under pressure in a state that the respective lines are brought into contact with each other. Further, the lines formed on the first printed circuit board 4 and the lines formed on the semiconductor packages 3A may be connected with each other using an adhesive material such as solder or an anisotropic conductive resin in place of the mechanical connection using the connector 401, for example.

Further, in the liquid crystal display device of this embodiment, the second printed circuit board 5 and a protection member (Tcon cover) 6 which covers the second printed circuit board 5 are mounted on a bottom surface 204b of the lower frame 204. The second printed circuit board 5 is generally referred to as a Tcon substrate and is a printed circuit board including a circuit which generates video or image data signals and clock signals for controlling timings of display of the videos or the images, and outputs the data signals and the clock signals to the semiconductor packages 3A, 3B.

Further, the second printed circuit board 5 is connected with the first printed circuit board 4A using the flexible printed wiring board 7 (7A), and is connected with the first printed circuit board 4B using the flexible printed wiring board 7 (7B). Hereinafter, when it is necessary to distinguish two flexible printed wiring boards 7 from each other, the respective flexible printed wiring boards are described as "flexible printed wiring board 7A" and "flexible printed wiring board 7B", while when it is unnecessary to distinguish two flexible printed wiring boards 7 from each other, the respective flexible printed wiring boards are described as "flexible printed wiring boards 7".

Further, as in the case of the liquid crystal display device of this embodiment, when only the semiconductor packages 3A which are connected to the video signal lines formed on the liquid crystal display panel 1 are mounted on the first printed circuit board 4, the first printed circuit board 4A which is arranged closer to a side of the liquid crystal display panel 1 on which the semiconductor packages 3B connected to the scanning signal lines formed on the liquid crystal display panel 1 are mounted also performs a function of transferring signals outputted from the second printed circuit board 5 to the semiconductor packages 3B. Accordingly, the flexible printed wiring board 7A which connects the second printed circuit board 5 and the first printed circuit board 4A includes a larger number of lines than the flexible printed wiring board 7B which connects the second printed circuit board 5 and the first printed circuit board 4B, and has a larger width than a width of the flexible printed wiring board 7B, for example.

Further, the lines formed on the first printed circuit board 4 and the lines formed on the flexible printed wiring board 7 are mechanically connected with each other using the connector 402 mounted on the first printed circuit board 4, for example. In the same manner as described above, the lines formed on the second printed circuit board 5 and the lines formed on the flexible printed wiring board 7 are mechanically connected with each other using the connector 501 mounted on the second printed circuit board 5, for example. Here, the mechanical connections using the connectors 402, 501 imply that the respective lines are electrically connected with each other by fixing them under pressure in a state that the respective lines are brought into contact with each other, for example.

Further, the liquid crystal display device of this embodiment includes a picture-frame-like mold frame (also referred to as a middle frame) 8 which is arranged between the liquid crystal display panel 1 and the backlight unit 2, and a picture-frame-like frame member (hereinafter, referred to as an upper frame) 9 which is arranged on a display-screen-1a-side of the liquid crystal display panel 1. For example, the mold frame 8 and the lower frame 204, the upper frame 9 and the mold frame 8 are fixed to each other using bolts, and the upper frame 9 and the lower frame 204 are fixed to each other using bolts thus integrally forming the display device.

Here, the above-mentioned constitution of the liquid crystal display device of this embodiment is the constitution which the conventional liquid crystal display device possesses.

The constitution which makes the liquid crystal display device of this embodiment differ from the conventional liquid crystal display device lies in that, as shown in FIG. 1C and FIG. 1D, a foreign material intrusion preventing member 10 is interposed between the first printed circuit board 4 and an outer peripheral surface 204a of the lower frame 204.

The foreign material intrusion preventing member 10 forms a region which overlaps the connector 402 of the first printed circuit board 4 as viewed in a plan view on a portion thereof interposed between the first printed circuit board 4 and the lower frame 401. Further, the foreign material intrusion preventing member 10 has a portion thereof projected from an end portion of the first printed circuit board 4 toward the second printed circuit board 5 side along the flexible printed wiring board 7, Here, it is desirable to configure the foreign material intrusion preventing member 10 such that an end portion 10a of the portion of the foreign material intrusion preventing member 10 which projects toward the second printed circuit board 5 and is arranged closer to the second printed circuit board 5 is brought into contact with the flexible printed wiring board 7 as shown in FIG. 1C.

Then, the foreign material intrusion preventing member 10 may preferably be made of a film-shaped insulation material having flexibility. For example, the foreign material intrusion preventing member 10 is formed in a film shape using polyethylene terephthalate (PET) as a material.

Further, the foreign material intrusion preventing member 10 has a portion thereof interposed between the first printed circuit board 4 and the outer peripheral surface 204a of the lower frame 204 fixed by adhesion to the lower frame 204 (outer peripheral surface 204a) using a tacky adhesive material or an adhesive material 11.

Here, the liquid crystal display device of this embodiment is generally referred to as a liquid crystal display module, and is housed in a casing when the liquid crystal display device is used as a so-called display device such as a liquid crystal television receiver set. Here, as shown in FIG. 1B, there exists a possibility that the liquid crystal display device (module) is housed in the casing 12 in a state that the first printed circuit board 4 and the second printed circuit board 5 are arranged on the lower side of the display region DA, for example. Here, the lower side of the display region in this specification implies a side which is arranged closer to a ground surface out of two sides which are arranged in parallel to the ground surface irrelevant to upper and lower sides and left and right sides of an image to be displayed in the display region DA.

Further, the liquid crystal display device of this embodiment acquires the following advantageous effects when the liquid crystal display device is, as shown in FIG. 1B, housed in the casing 12 in a state that the first printed circuit board 4 and the second printed circuit board 5 are arranged on the lower side of the display region DA.

Figure 2A:
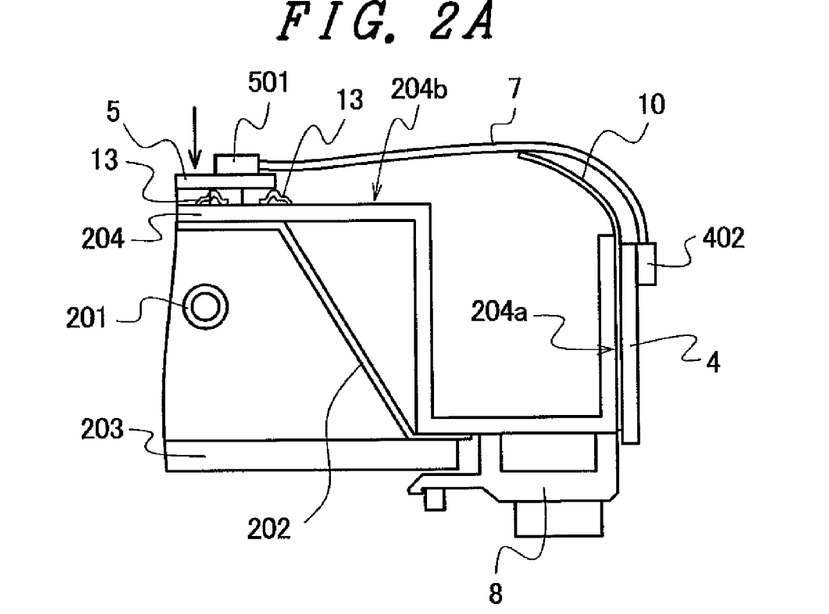
FIG. 2A is a schematic view showing one example of a phenomenon which occurs in mounting the second printed circuit board.
Figure 2B:
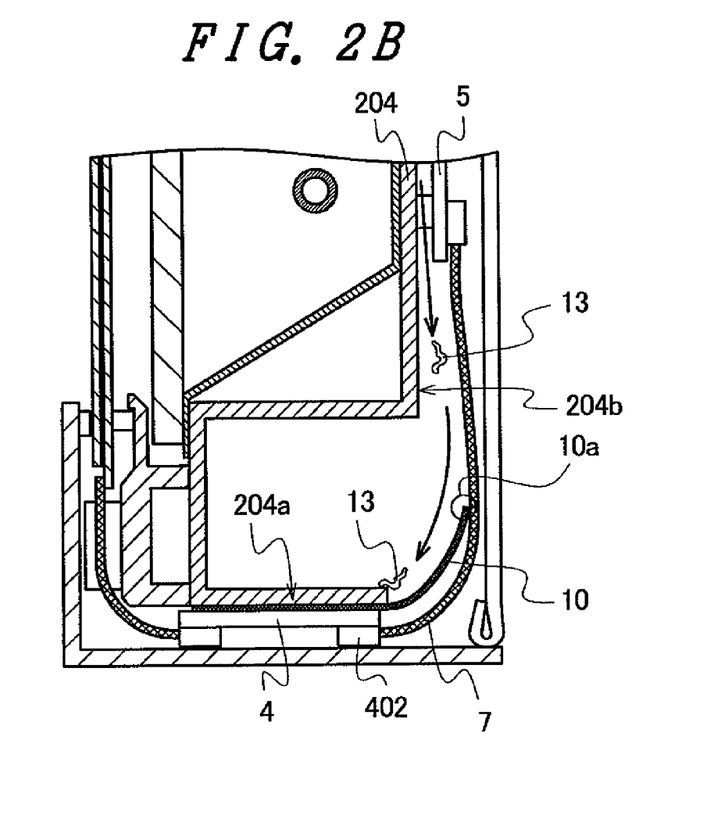
FIG. 2B is a schematic view showing one example of a phenomenon which occurs after an assembling of the liquid crystal display device is completed.

FIG. 2A and FIG. 2B are schematic views for explaining advantageous effects of the liquid crystal display device of this embodiment.

FIG. 2A is a schematic view showing one example of a phenomenon which occurs in mounting the second printed circuit board. FIG. 2B is a schematic view showing one example of a phenomenon which occurs after assembling of the liquid crystal display device is completed.

To briefly explain assembling steps of the liquid crystal display device of this embodiment, first of all, an assembling operation of the backlight unit is performed such that the reflector 202, the tubular light source 201 and the like are housed in the lower frame 204, and the lower fame 204 is covered with the light diffusion plate 203. Next, the mold frame 8 and the liquid crystal display panel 1 are mounted on the light diffusion plate 203 of the backlight unit. Here, for example, on the liquid crystal display panel 1, the semiconductor packages 3A, 3B, the first printed circuit board 4 and the flexible printed wiring board 7 are already mounted, the liquid crystal display panel 1 is mounted on the mold frame 8 and, thereafter, the first printed circuit board 4 is mounted on the outer peripheral surface 204a of the lower frame 204 by bending the semiconductor package 3A. Next, the lower frame 204 is covered with the upper frame 9, the upper frame 9 and the mold frame 8 are fixed to each other using bolts, and the upper frame 9 and the lower frame 204 are fixed to each other using bolts.

Here, in assembling the liquid crystal display device in accordance with the above-mentioned steps, the foreign material intrusion preventing member 10 is adhered to the outer peripheral surface 204a of the lower frame 204 in advance or before the lower frame 204 is covered with the upper frame 9.

Thereafter, for example, the Tcon substrate 5 is fixedly mounted on the bottom surface 204b of the lower frame 204 using bolts, and the flexible printed wiring board 7 which is connected to the first printed circuit board 4 is connected to the Tcon substrate 5. Further, in connecting the flexible printed wiring board 7 to the Tcon substrate 5, the flexible printed wiring board 7 is mounted on the Tcon substrate 5 after bending the portion of the foreign material intrusion preventing member 10 which projects from the outer peripheral surface 204a of the lower frame 204 toward the second printed circuit board 5.

In mounting the second printed circuit board 5 on the lower frame 204, the second printed circuit board 5 is fixed to the lower frame 204 using bolts in many cases. Accordingly, as shown in FIG. 2A, in performing the fixing operation using the bolts, there exists a possibility that a metal foreign material 13 is generated between the second printed circuit board 5 and the bottom surface 204b of the lower frame 204. For example, when the assembling steps of the liquid crystal display device progresses without being aware of the presence of the generated metal foreign material 13, the metal foreign material 13 remains in the liquid crystal display device after completion of the assembling of the device. Accordingly, after completion of assembling of the liquid crystal display device, assuming a state equal to a state in which the liquid crystal display device is housed in the casing upright, as shown in FIG. 2B, the metal foreign material 13 falls, for example.

As in the case of the conventional liquid crystal display device, for example, when the metal foreign material 13 falls along the flexible printed wiring board 7, there exists a possibility that the metal foreign material 13 arrives at a connection portion between the connector 402 of the first printed circuit board 4 and the flexible printed wiring board 7 and intrudes into the inside of the connector 402 thus giving rise to a short-circuiting defect. Accordingly, an incidence rate of abnormal lighting is increased in the lighting inspection.

However, in the liquid crystal display device of this embodiment, the metal foreign material 13 which falls along the flexible printed wiring board 7 from a space defined between the second printed circuit board 5 and the bottom surface 204b of the lower frame 204 falls along the foreign material intrusion preventing member 10 in the course of falling. Accordingly, it is possible to prevent the occurrence of the short-circuiting in the inside of the connector 402 attributed to the intrusion of the fallen metal foreign material 13 into the inside of the connector 402. As a result, the incidence rate of abnormal lighting is decreased in the lighting inspection and hence, it is possible to enhance the efficiency of the assembling operation of the liquid crystal display device.

Here, in FIG. 2A, although a case in which the foreign material intrusion preventing member 10 is adhered to the outer peripheral surface 204a of the lower frame 204 is taken as an example, it is needless to say that the present invention is not limited to the above mentioned constitution and the foreign material intrusion preventing member 10 may be adhered to a surface of the first printed circuit board 4 which faces the outer peripheral surface 204a of the lower frame 204 in an opposed manner.

Further, it is sufficient for the foreign material intrusion preventing member 10 to prevent the metal foreign material 13 which falls from between the second printed circuit board 5 and the bottom surface 204b of the lower frame 204 along the flexible printed wiring board 7 from reaching the connection portion between the connector 402 of the first printed circuit board 4 and the flexible printed wiring board 7. Accordingly, the mounting method of the foreign material intrusion preventing member 10 is not limited to the method explained in conjunction with FIG. 2A and various methods may be considered. Hereinafter, modifications of the mounting method of the foreign material intrusion preventing member 10 are briefly explained hereinafter.

Figure 3A:
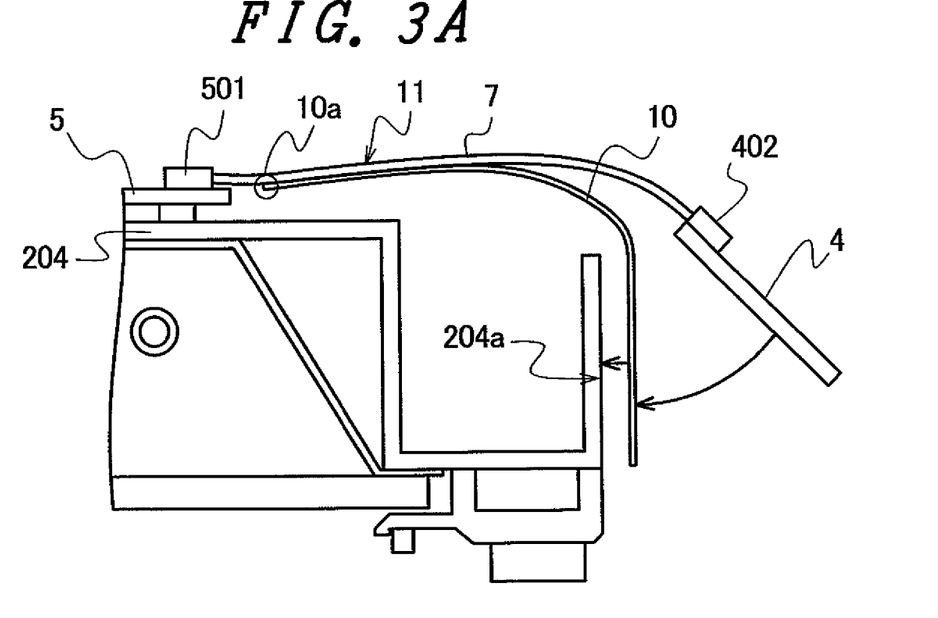
FIG. 3A is a schematic cross-sectional view for explaining a first modification of a mounting method of a foreign material intrusion preventing member.
Figure 3B:
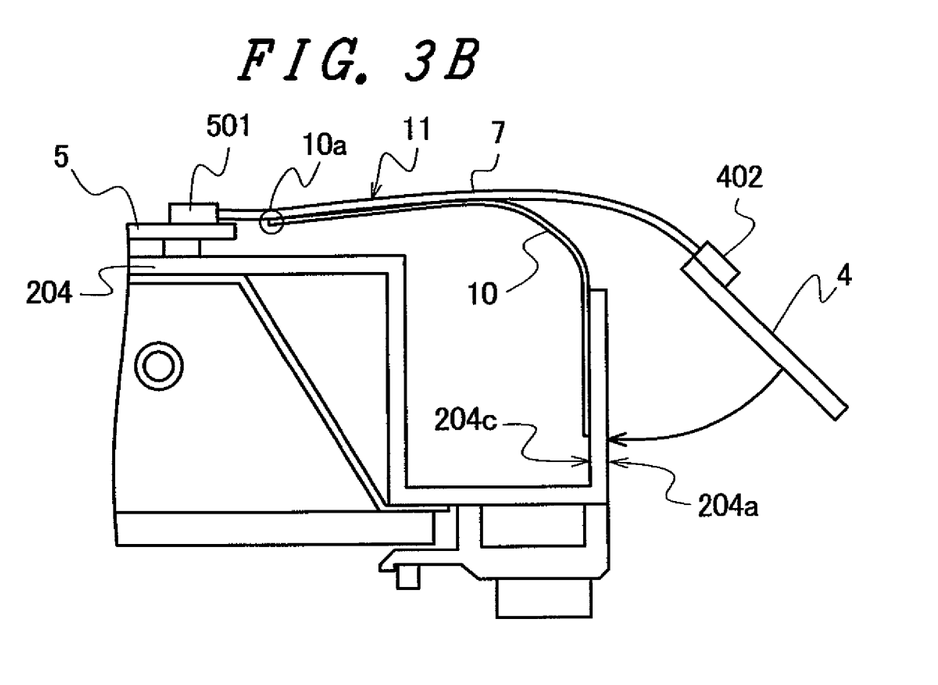
FIG. 3B is a schematic cross-sectional view for explaining a second modification of the mounting method of the foreign material intrusion preventing member.
Figure 3C:
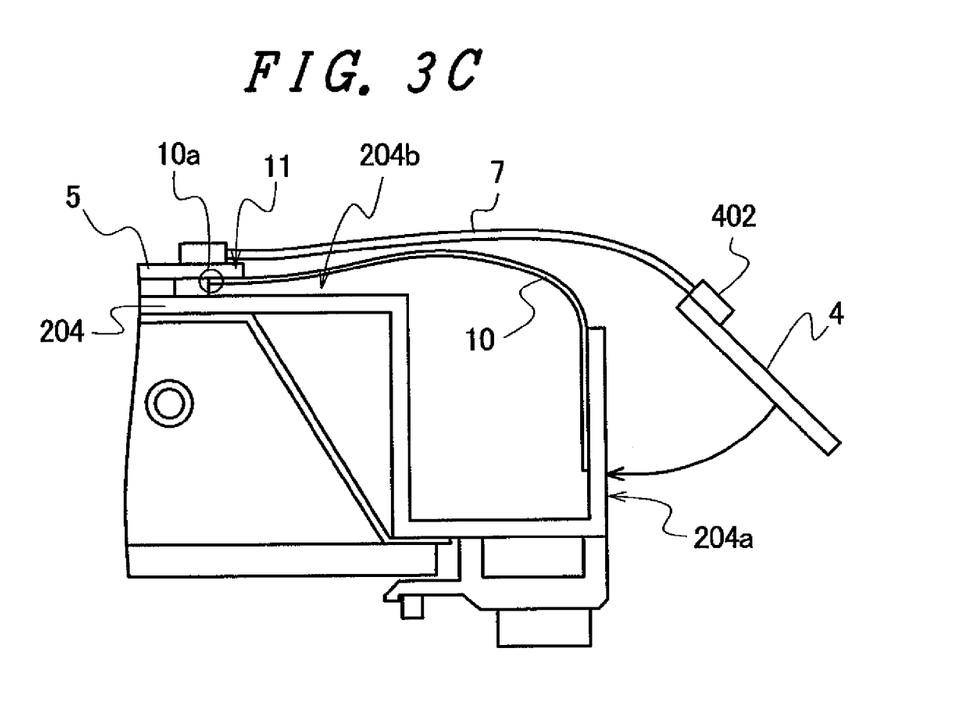
FIG. 3C is a schematic cross-sectional view for explaining a third modification of the mounting method of the foreign material intrusion preventing member.

FIG. 3A is a schematic cross-sectional view for explaining a first modification of a mounting method of a foreign material intrusion preventing member;

FIG. 3B is a schematic cross-sectional view for explaining a second modification of the mounting method of the foreign material intrusion preventing member, and FIG. 3C is a schematic cross-sectional view for explaining a third modification of the mounting method of the foreign material intrusion preventing member.

The foreign material intrusion preventing member 10 may have an end portion 10a of a portion thereof extended toward a second printed circuit board 5 side from an end portion of the first printed circuit board 4 and a region thereof in the vicinity of the end portion 10a adhered to a surface side of the flexible printed wiring board 7 which faces the lower frame 204 in an opposed manner. Here, by mounting the first printed circuit board 4 in a state that the foreign material intrusion preventing member 10 is sandwiched between the first printed circuit board 4 and an outer peripheral surface 204a of the lower frame 204, it is possible to provide the constitution similar to constitution of the liquid crystal display device of this embodiment and hence, it is possible to prevent the metal foreign material 13 which falls along the flexible printed wiring board 7 from intruding into the inside of the connector 402.

Further, with respect to the lower frame 204 of the liquid crystal display device of this embodiment, the outer peripheral portion of the lower frame 204 is folded such that the surface of the lower frame 204 which faces the liquid crystal display panel 1 forms the outer peripheral surface 204a. In such a constitution, for example, as shown in FIG. 3B, the outer peripheral surface 204a of the lower frame 204 may be sandwiched between the foreign material intrusion preventing member 10 and the first printed circuit board 4. Here, the foreign material intrusion preventing member 10 may have the end portion 10a of the portion thereof extended toward a second printed circuit board 5 side from the end portion of the first printed circuit board 3 and the region thereof in the vicinity of the end portion 10a adhered to the flexible printed wiring board 7 using an adhesive material 11 or the like. Here, instead of the flexible printed circuit board 7, the foreign material intrusion preventing member 10 may be adhered to a back surface 204c of the outer peripheral surface 204a of the lower frame 204.

Further, it is needless to say that the foreign material intrusion preventing member 10 may be adhered to a surface of the second printed circuit board 5 which faces the bottom surface 204b of the lower frame 204 using the adhesive material 11 or the like. Here, the foreign material intrusion preventing member 10 is, for example, as shown in FIG. 3C, arranged such that the lower frame 204 is sandwiched between the foreign material intrusion preventing member 10 and the first printed circuit board 4. Here, the foreign material intrusion preventing member 10 may be arranged to be sandwiched by the first printed circuit board 4 and the lower frame 204.

Figure 4A:
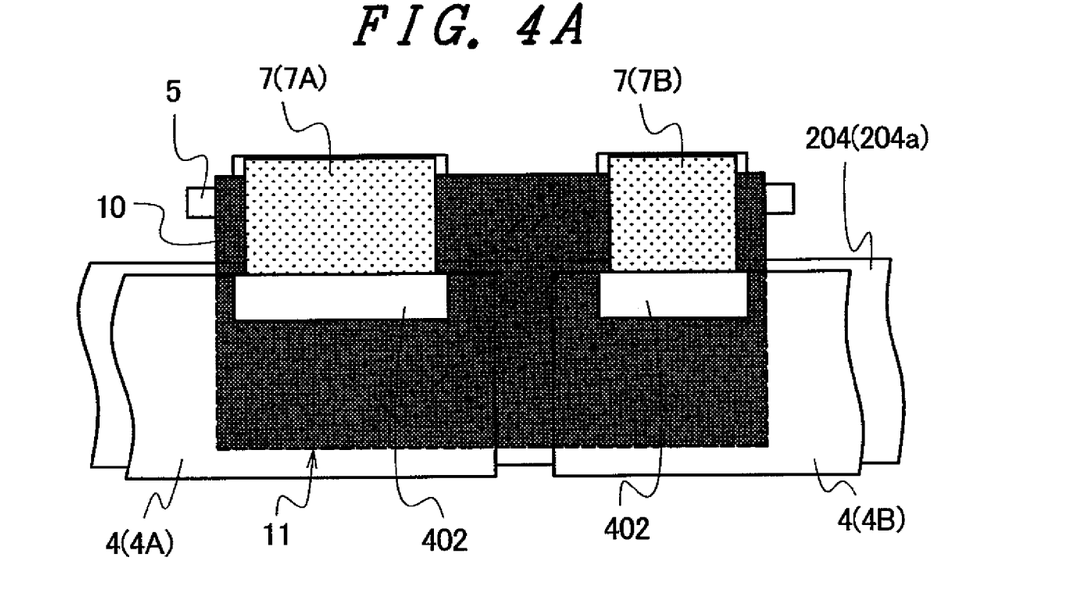
FIG. 4A is a schematic lower surface view for explaining a first modification of a shape of the foreign material intrusion preventing member.
Figure 4B:
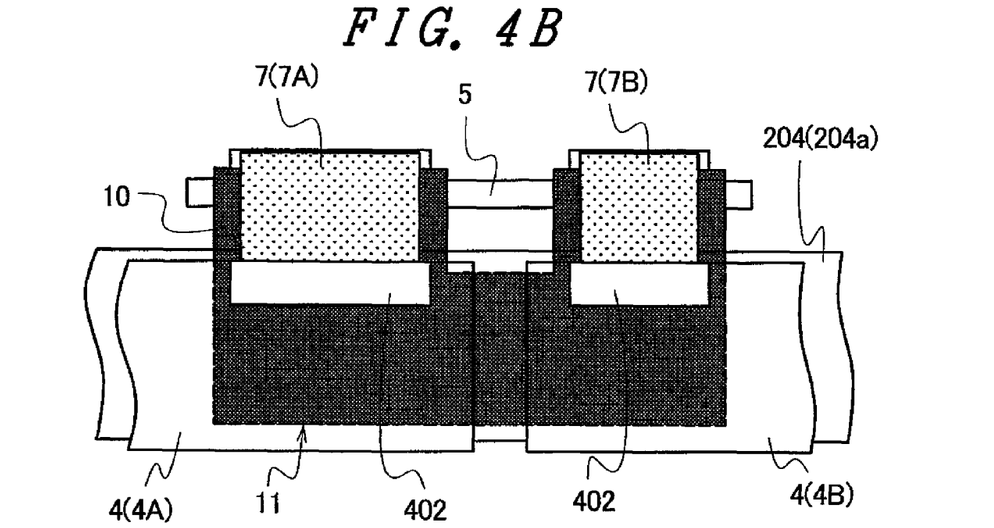
FIG. 4B is a schematic lower surface view for explaining a second modification of the shape of the foreign material intrusion preventing member.

FIG. 4A is a schematic lower surface view for explaining a first modification of a shape of the foreign material intrusion preventing member, and FIG. 4B is a schematic lower surface view for explaining a second modification of the shape of the foreign material intrusion preventing member. Here, FIG. 4A and FIG. 4B show the same regions in FIG. 1D.

In this embodiment, as an example of the foreign material intrusion preventing member 10, a member which prevents the intrusion of the metal foreign material 13 into the connection portion between the connector 402 of the first printed circuit board 4A and the flexible printed wiring board 7A, and a member which prevents the intrusion of the metal foreign material 13 into the connection portion between the connector 402 of the first printed circuit board 4B and the flexible printed wiring board 7B are formed as members separated from each other. However, the foreign material intrusion preventing member 10 is not limited to such constitution. For example, as shown in FIG. 4A, using one sheet of member, it is possible to prevent the intrusion of the metal foreign material 13b into the connection portion between the connector 402 of the first printed circuit board 4A and the flexible printed wiring board 7A and the connection portion between the connector 402 of the first printed circuit board 4B and the flexible printed wiring board 7B respectively.

Here, the foreign material intrusion preventing member 10 may be configured, for example, as shown in FIG. 4B, such that a portion of the foreign material intrusion preventing member 10 which projects toward the second printed circuit board 5 side from the end portion of the first printed circuit board 4 is divided into a portion which projects along the flexible printed wiring board 7A and a portion which projects along the flexible printed wiring board 7B.

As has been explained above, although the present invention has been explained specifically based on the embodiment, the present invention is not limited to the above-mentioned embodiment and various modifications can be made without departing from the gist of the present invention.

For example, the constitution of the backlight unit 2 named in the embodiment is one example of the so-called direct-type backlight unit used in a transmissive liquid crystal display device. The present invention is applicable to a direct-type backlight unit having the constitution different from the constitution explained in conjunction with FIG. 1C and a liquid crystal display device having a edge-light-type or side-light-type backlight unit.

Further, in the above-mentioned embodiment, the explanation is made with respect to a case in which a signal outputted to the semiconductor package 3B connected to the scanning signal lines formed on the liquid crystal display panel 1 from the second printed circuit board 5 is transmitted through the semiconductor package 3A connected to the video signal line, the first printed circuit board 4 and the flexible printed wiring board 7A. However, the present invention is not limited to such a case and may be configured such that the semiconductor package 3B is connected to the second printed circuit board 5 through a printed circuit board different from the first printed circuit board 4 and the flexible printed wiring board.

Further, in the above-mentioned embodiment, the explanation is made with respect to the constitution in which the semiconductor packages 3A, 3B which mount a driver IC thereon are mounted on the liquid crystal display panel 1. However, the present invention is not limited to such constitution and the driver IC (IC chip) may be mounted on the TFT substrate of the liquid crystal display panel 1. Further, an integrated circuit having a function substantially equal to a function of the driver IC may be integrally formed on the TFT substrate.

Further, in the above-mentioned embodiment, the explanation is made with respect to the transmissive liquid crystal display device as an example. However, the present invention is not limited to such a liquid crystal display device and may be applicable to a transmissive or transflective liquid crystal display device having other constitution or a reflective liquid crystal display device.

Further, the explanation is made with respect to the liquid crystal display device of this embodiment. However, the present invention is not limited to such a liquid crystal display device. For example, the present invention is applicable to any display device which mounts two printed circuit boards which are connected using the flexible printed wiring board on the frame member. As a display device other than the liquid crystal display device to which the present invention is applicable, a self-luminous display device having a PDP (Plasma Display Panel) or a display panel which uses organic EL (Electro Luminescence) can be named.

What is claimed is:

1. A display device comprising:
   a display panel;
   a first printed circuit board;
   a first flexible printed wiring board connected to the display panel and the first printed circuit board;
   a second printed circuit board;
   a second flexible printed wiring board connected to the first printed circuit board and the second printed circuit board; and
   a frame member on which the first printed circuit board and the second printed circuit board are mounted;
   wherein the display device comprises a film shaped member which overlaps a surface of the first printed circuit board which faces the frame member and projects from an end portion of the first printed circuit board toward the second printed circuit board along the second flexible printed wiring board.

2. A display device according to claim 1, wherein an IC chip is mounted on the first flexible printed circuit board.

3. A display device according to claim 1, wherein the surface of the first printed circuit board which faces the frame member and a surface of the second printed circuit board which faces the frame member are arranged substantially orthogonal to each other.

4. A display device according to claim 1, wherein a portion of the film shaped member which projects from the end portion of the first printed circuit board toward the second printed circuit board has an end portion thereof arranged closer to the second printed circuit board brought into contact with the second flexible printed wiring board.

5. A display device according to claim 1, wherein the film shaped member is a foreign material intrusion preventing member.

6. A display device according to claim 1, wherein a portion of the film shaped member which projects from the end portion of the first printed circuit board toward the second printed circuit board has an end portion thereof arranged closer to the second printed circuit board adhered to the second flexible printed wiring board.

7. A display device according to claim 1, wherein the film shaped member is made of an insulation material.

* * * * *